(12) United States Patent
Sun et al.

(10) Patent No.: US 8,895,841 B2
(45) Date of Patent: Nov. 25, 2014

(54) CARBON NANOTUBE BASED SILICON PHOTOVOLTAIC DEVICE

(75) Inventors: Hai-Lin Sun, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 470 days.

(21) Appl. No.: 12/339,364

(22) Filed: Dec. 19, 2008

(65) Prior Publication Data

US 2009/0260688 A1   Oct. 22, 2009

(30) Foreign Application Priority Data

Apr. 18, 2008  (CN) .......................... 2008 1 0066750

(51) Int. Cl.
| | | |
|---|---|---|
| *H01L 31/00* | (2006.01) | |
| *H01L 31/0236* | (2006.01) | |
| *H01L 31/068* | (2012.01) | |
| *H01L 31/0224* | (2006.01) | |
| *H01L 31/18* | (2006.01) | |
| *H01L 31/0745* | (2012.01) | |

(52) U.S. Cl.
CPC .... *H01L 31/022466* (2013.01); *H01L 31/1884* (2013.01); *Y02E 10/50* (2013.01); *H01L 31/0745* (2013.01); *Y10S 977/742* (2013.01); *Y10S 977/932* (2013.01); *Y10S 977/948* (2013.01)
USPC ........... 136/256; 136/255; 136/258; 136/261; 977/742; 977/932; 977/948

(58) Field of Classification Search
USPC ............... 136/255, 256, 258, 261; 423/447.1; 977/742
See application file for complete search history.

(56) References Cited

U.S. PATENT DOCUMENTS

| | | | |
|---|---|---|---|
| 5,100,478 A | * | 3/1992 | Kawabata ..................... 136/249 |
| 7,691,533 B2 | | 4/2010 | Sano et al. |
| 7,704,480 B2 | | 4/2010 | Jiang et al. |
| 2002/0130605 A1 | | 9/2002 | Mueller et al. |
| 2004/0028875 A1 | | 2/2004 | Van Rijn et al. |

(Continued)

FOREIGN PATENT DOCUMENTS

| | | |
|---|---|---|
| CN | 1933210 | 3/2007 |
| CN | 1937258 | 3/2007 |

(Continued)

OTHER PUBLICATIONS

Jiang et al, "Spinning continuous carbon nanotube yarns", Oct. 24 2002, Nature, vol. 419, p. 801.*

(Continued)

*Primary Examiner* — Jonathan Johnson
*Assistant Examiner* — Andrew Golden
(74) *Attorney, Agent, or Firm* — Novak Druce Connolly Bove + Quigg LLP

(57) ABSTRACT

A photovoltaic device includes a silicon substrate, an intrinsic layer, a carbon nanotube structure and a first electrode. The silicon substrate has a front surface and a rear surface. The intrinsic layer is disposed on the front surface of the silicon substrate. The carbon nanotube structure is disposed on the intrinsic layer. The first electrode is disposed on the rear surface of the silicon substrate.

18 Claims, 4 Drawing Sheets

(56) References Cited

U.S. PATENT DOCUMENTS

| | | |
|---|---|---|
| 2004/0074531 A1 | 4/2004 | Matsui et al. |
| 2004/0123897 A1 | 7/2004 | Ojima et al. |
| 2004/0177878 A1 | 9/2004 | Maruyama |
| 2005/0098204 A1 | 5/2005 | Roscheisen et al. |
| 2005/0268963 A1 | 12/2005 | Jordan et al. |
| 2006/0055392 A1 | 3/2006 | Passmore et al. |
| 2006/0062944 A1 | 3/2006 | Gardner et al. |
| 2006/0067871 A1 | 3/2006 | Hart et al. |
| 2007/0006914 A1* | 1/2007 | Lee ............... 136/261 |
| 2007/0026645 A1 | 2/2007 | Lieber et al. |
| 2007/0119496 A1 | 5/2007 | Baldo et al. |
| 2007/0153362 A1 | 7/2007 | Gruner |
| 2007/0240757 A1* | 10/2007 | Ren et al. ............ 136/256 |
| 2007/0256728 A1 | 11/2007 | Cousins |
| 2007/0273264 A1 | 11/2007 | Choi et al. |
| 2007/0277874 A1 | 12/2007 | Dawson-Elli et al. |
| 2007/0284987 A1 | 12/2007 | Liu et al. |
| 2008/0066802 A1 | 3/2008 | Reddy |
| 2008/0211101 A1 | 9/2008 | Han et al. |

FOREIGN PATENT DOCUMENTS

| | | |
|---|---|---|
| CN | 1996620 | 7/2007 |
| JP | S57-130483 | 8/1982 |
| JP | S59-23570 | 2/1984 |
| JP | H05-21821 | 1/1993 |
| JP | H05-243594 | 9/1993 |
| JP | H05-335614 | 12/1993 |
| JP | H06-77511 | 3/1994 |
| JP | H11-103080 | 4/1999 |
| JP | 2002-520818 | 7/2002 |
| JP | 2003-179241 | 6/2003 |
| JP | 2003-209270 | 7/2003 |
| JP | 2004-64028 | 2/2004 |
| JP | 2005-327965 | 11/2005 |
| JP | 2006-171336 | 6/2006 |
| JP | 2006-210780 | 8/2006 |
| JP | 2007-96136 | 4/2007 |
| JP | 2007-115806 | 5/2007 |
| JP | 2007-126338 | 5/2007 |
| JP | 2007161563 | 6/2007 |
| JP | 2007161576 | 6/2007 |
| JP | 2009-117463 | 5/2009 |
| TW | 200511632 | 3/2005 |
| TW | 200520243 | 6/2005 |
| TW | 200629581 | 8/2006 |
| TW | 200703698 | 1/2007 |
| TW | 319521 | 9/2007 |
| TW | 200738553 | 10/2007 |
| TW | 200800798 | 1/2008 |
| WO | WO2004068548 | 8/2004 |
| WO | WO2007015710 | 2/2007 |
| WO | WO2007-037343 | 4/2007 |

OTHER PUBLICATIONS

Wei et al., Double-Walled Carbon Nanotube Solar Cells, Nano Letters, Jul. 3, 2007, vol. 7, No. 8, pp. 2317-2321.

Somani et al., Application of metal nanoparticles decorated carbon nanotubes in photovoltaics, Applied Physics Letters, Jul. 25, 2008, vol. 93, No. 3, pp. 033315.

Pillai et al., Surface Plasmon enhanced silicon solar cells, Journal of Applied Physics, May 7, 2007, vol. 101, No. 9, pp. 093105-1-093105-8.

Liu et al., Controlled growth of super-aligned carbon nanotube arrays for spinning continuous unidirectional sheets with tunable physical properties, Nano Letters vol. 8, No. 2, 700-705(2008).

Jiang et al. "Spinning continuous carbon nanotube yarns" Oct. 24, 2002, Nature, vol. 419, p. 801.

Contreras et al. "Replacement of Transparent Conductive Oxides by Single-Wall Carbon Nanotubes in Cu(In,Ga)Se2-Based Solar Cells" The Journal of Physical Chemistry C Letters, 2007, 06, 09, vol. 111, p. 14045-14048.

Wu et al. "Transparent, Conductive Carbon Nanotube Films" Science, 2004, 08, 27, vol. 305, No. 5688, p. 1273-1276.

* cited by examiner

CARBON NANOTUBE BASED SILICON PHOTOVOLTAIC DEVICE

BACKGROUND

1. Technical Field

The invention relates to energy conversion devices, and particularly to a photovoltaic device.

2. Description of Related Art

Currently, solar energy is considered a renewable and clean energy source, and can also be used as an alternative source of energy other than fossil fuel. Solar energy is generally produced by photovoltaic cells, also known as solar cells. The photovoltaic cell or the solar cell is a device that converts light into electrical energy using the photoelectric effect.

Generally, the solar cell is usually made from silicon. Silicon employed in the solar cell can be single crystal silicon or polycrystalline silicon. Referring to FIG. 4, a conventional solar cell 30 according to the prior art, generally includes a silicon substrate 31, an intrinsic layer 32, a doped silicon layer 33, a front electrode 34, and a rear electrode 35. The silicon substrate 31 is made of polycrystalline silicon. In such case, the silicon substrate 31 is usually doped to form p-type silicon while the doped silicon layer 33 is usually doped to form n-type silicon. The intrinsic layer 32 is disposed between the silicon substrate 31 and the doped silicon layer 33 to create a p-i-n structure. The front electrode 34 is disposed on and electrically connected to the doped silicon layer 33. The rear electrode 35 is disposed on and electrically connected to, e.g. via ohmic contact, the silicon substrate 31. In addition, the solar cell 30 further includes a metal electrode 36 disposed on and electrically connected to the front electrode 34.

In use, if sunlight strikes the solar cell 30, the free electrons and holes are generated and separated to contribute a current. Particularly, the free electrons move toward the rear electrode 35 and the free holes move toward the front electrode 34. Current flow through the front electrode 34 can be collected via the metal electrode 36. Additionally, the electrodes 36 and 35 are connected to an external load. Trough the p-i-n structure, recombination speed of such mobile carriers is lowered by way of disposition of the intrinsic layer 32. Therefore, the photoelectric conversion efficiency on the solar cell 30 is increased.

Generally, the front electrode 34 is made of conductive metals, such as aluminum (Al), silver (Ag) or copper (Cu), which are usually not transparent to light. In order to increase the amount of incoming light, transparent conductive material, e.g. indium tin oxide (ITO), may instead be selected to form the front electrode 34. However, ITO material has drawbacks of, for example, being not chemically and mechanically durable, and having uneven distribution of resistance. As a result, the durability and the photoelectric conversion efficiency are relatively low.

What is needed, therefore, is a photovoltaic device that overcomes the above problems.

BRIEF DESCRIPTION OF THE DRAWINGS

The components in the drawing are not necessarily drawn to scale, the emphasis instead being placed upon clearly illustrating the principles of the present invention.

Figure 1:
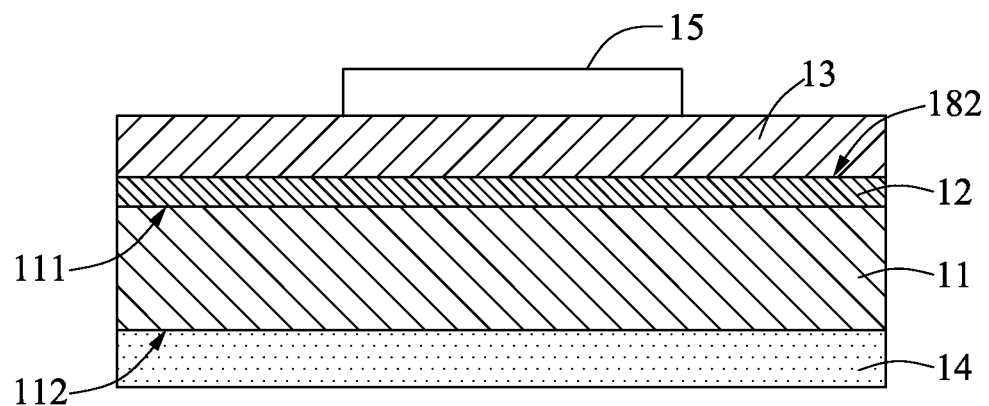
FIG. 1 is a schematic lateral view showing a photovoltaic device in accordance with an exemplary embodiment.

Corresponding reference characters indicate corresponding parts throughout the drawings. The exemplifications set out herein illustrate at least one embodiment of the present photovoltaic device, in one form, and such exemplifications are not to be construed as limiting the scope of the disclosure in any manner.

DETAILED DESCRIPTION OF THE EMBODIMENT

Reference will now be made to the drawings to describe embodiments of the present photovoltaic device in detail.

Referring to FIG. 1, a photovoltaic device 10 according to an exemplary embodiment, is shown. The photovoltaic device 10 includes a silicon substrate 11, an intrinsic layer 12, a carbon nanotube (CNT) structure 13, and a first electrode 14.

The silicon substrate 11 is made of single-crystal silicon or polycrystalline silicon. The silicon substrate 11 has a front surface 111 and a rear surface 112, as shown in FIG. 1. In addition, a thickness of the substrate 11 is in an approximate range from about 200 micrometer ($\mu m$) to about 300 $\mu m$. In the exemplary embodiment, the silicon substrate 11 is a n-type silicon.

The intrinsic layer 12 is disposed on the front surface 111 of the silicon substrate 11. The intrinsic layer 12 is made of silicon dioxide ($SiO_2$) or silicon nitride ($Si_3N_4$) as an insulating layer. The intrinsic layer 12 of the exemplary embodiment has a thickness of about 1 angstrom (Å) to about 30 Å. Suitably, a thickness of the intrinsic layer 12 is about 10 Å.

The CNT structure 13 is disposed on the intrinsic layer 12. The CNT structure 13 is adapted to absorb light and the light then generates electrons and holes very near the junction between the CNT structure 13 and the silicon substrate 11. The free electrons and holes are separated before they recombine with each other and sweep across in opposite directions due to the electric field. In addition, the intrinsic layer 12 between the silicon substrate 11 and the CNT structure 13 is configured to further lower the speed of recombination of electrons and holes.

Figure 2:
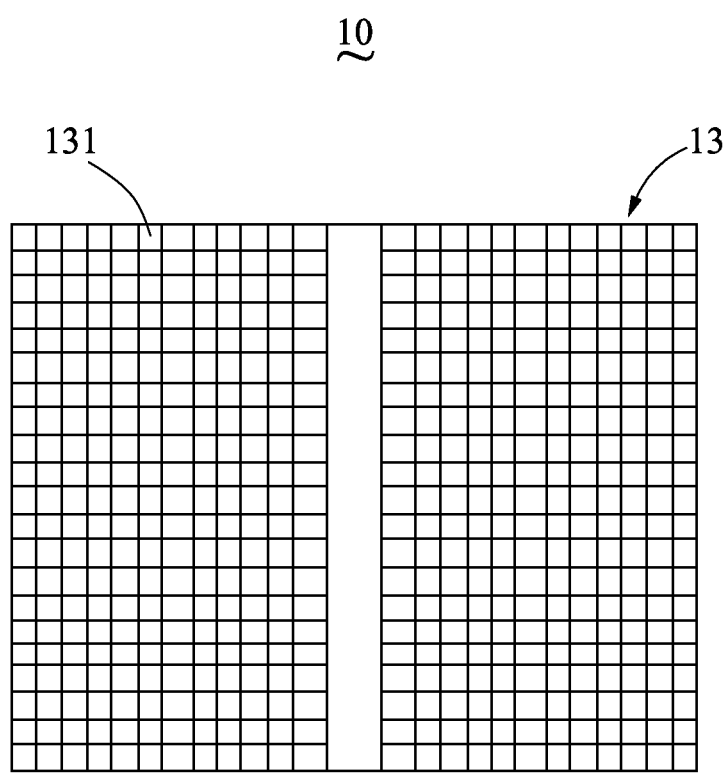
FIG. 2 is a schematic vertical view showing the photovoltaic device of FIG. 1.

Referring to FIG. 1 and FIG. 2, the CNT structure 13 includes one or more CNT layers 131. The CNT layers 131 can comprise of a plurality of uniformly distributed and/or disordered CNTs. The CNTs of the CNT layer 131 can be arranged orderly or disorderly/randomly. In the ordered CNT layer, the CNTs of the ordered CNT layer are oriented along a single direction. Alternatively, the CNTs layers 131 of the CNT structure 13 can be oriented along different directions. In the disordered CNT layer, CNTs entangle with each other or are arranged in an isotropic manner.

In the present embodiment, the CNTs of the CNT layer 131 can be selected from a group consisting of single-walled carbon nanotubes (SWCNTs), double-walled carbon nanotubes, multi-walled carbon nanotubes (MWCNTs), and combinations thereof. In such case, when the SWCNTs are employed in the CNT layer 131, a diameter of each of the SWCNTs is in a range from about 0.5 nm to about 50.0 nm. Alternatively, when the double-walled carbon nanotubes are employed in the CNT layer 131, a diameter of each of the double-walled carbon nanotubes is in a range from about 1.0 nm to about 50.0 nm. In addition, when the MWCNTs are employed in the CNT layer 131, a diameter of each of the MWCNTs is in a range from about 1.5 nm to about 50.0 nm. In the exemplary embodiment, the CNT layer 131 can be directly adhered on the intrinsic layer 12 because the CNTs have high purity and high specific surface area.

Figure 3:
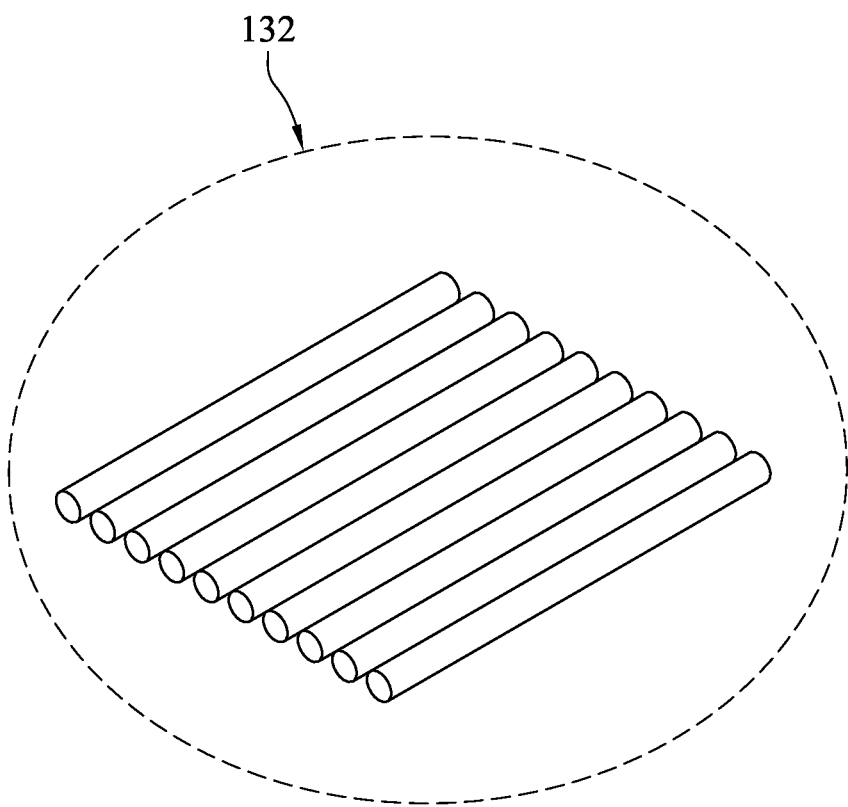
FIG. 3 is a schematic enlarged view showing a portion of a carbon nanotube structure of the photovoltaic device of FIG. 1.
Figure 4:
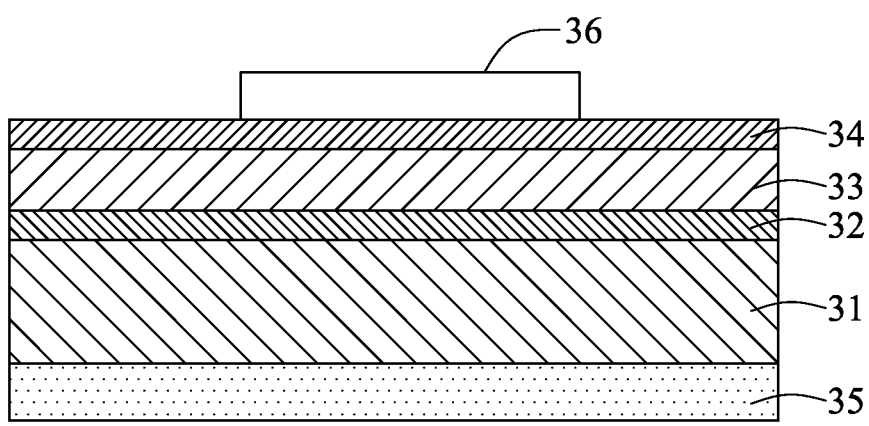
FIG. 4 is a schematic view of a conventional solar cell according to the prior art.

Alternatively, the CNT layer 131 can comprise of one or more CNT films. The CNT film can be fabricated by being drawn from a CNT array. In the exemplary embodiment, the CNT array is formed on a 4-inch silicon by vapor deposition. The CNT film includes a plurality of successively oriented CNT segments 132 joined end-to-end by van der Waals attractive force, as shown in FIG. 3. Each CNT segment 132 includes a plurality of CNTs substantially parallel to each other and of approximately the same length. Adjacent CNTs are also attracted by van der Waals attractive force. Due to substantially parallel-arranged and uniformly distribution of CNTs, the photovoltaic device 10 has uniform electric resistance, improved conductivity and high energy conversion efficiency. In the exemplary embodiment, the CNT film has a width in an approximate range from 0.01 cm to 10.00 cm and a thickness in an approximate range from 10 nm to 100 nm. In practice, the CNT segments can vary in width, thickness, uniformity, and shape.

In the exemplary embodiment, each CNT layer 131 includes a plurality of successively stacked CNT films. The alignment direction of two adjacent CNT films can be set at an angle to each other. That angle can range from 0 to 90 degrees. The number of stacked CNT films for each CNT layer 131 can be chosen according to the practical requirements, forming different thickness of the CNT layer 131. Also, the number CNT layers 131 can be chosen according to the practical requirements, forming different thickness of the CNT structure 13. In the exemplary embodiment, the CNT structure 13 includes one CNT layer, which has four CNT films stacked at an angle to the adjacent films.

However, the CNT structure 13 is not limited to what is mentioned above. The CNT layer 131 can include a plurality of CNT films substantially parallel to one another so as to form the CNT structure 13. As mentioned above, the CNT structure 13 can have multiple stacked CNT layers 131 each having one or more co-planar CNT films. In an arrangement of multiple co-planar CNT films, the orientation of the CNT films can be set at an angle to adjacent co-planar CNT films.

In other embodiments, the CNT layer 131 can comprise of one or more CNT wires. The CNT wire can be formed by treating the CNT film drawn from a CNT array with a solvent. A plurality of CNT wires can then be assembled together to form the CNT layer of the present embodiment. The CNTs of each CNT wire are successively oriented along an axis of the CNT wire. In addition, the CNT wires can be formed in twisted form, e.g. by a twisting process, or in bundle form. In one embodiment, the carbon nanotubes in twisted form can be twisted spirally along the axis of the CNT wire. Treatment of the twisted wires can occur before or after the twisting process, if at all.

Alternatively, the CNT structure 13 also can comprise of at least two CNT layers 131 where one layer includes one or more CNT films and the other layer includes one or more CNT wires. The CNT wires are arranged parallel to each other and disposed adjacent to the CNT film. If the CNT structure 13 has a plurality of CNT layers, each CNT film and the CNT wires can be alternately stacked. In the present embodiments, the alignment direction of the CNT film and the adjacent CNT wires can be substantially parallel to on another or set at an angle.

Alternatively, the CNT structure 13 also can be formed by coating a composited material of a mixture of CNT powders and metal powders on the silicon substrate 11.

The first electrode 14 is disposed on and electrically connected to the rear surface 112 of the silicon substrate 11 via ohmic contact, as shown in FIG. 1. The first electrode 14 can be made of aluminum (Al), magnesium (Mg) or silver (Ag). In addition, the first electrode 14 has a thickness in an approximate range from 10 μm to 300 μm. The photovoltaic device 10 of the exemplary embodiment can further include a second electrode 15 disposed on the CNT structure 13. The second electrode 15 can be made of conductive material, such as silver, gold (Au), or CNTs. The second electrode 15 can vary in thickness and shape.

In use, light strikes the photovoltaic device 10, radiated photos are absorbed by the CNT structure 13 and create many mobile carriers (hole-electron pairs) at the heterostructure formed by the interface of the silicon substrate 11 and the CNT structure 13. Then, the hole-electron pairs are separated to form a plurality of holes and electrons by the electrostatic potential energy. The holes move across the silicon substrate 11 to the first electrode 14 and are collected by the first electrode 14. The electrons are transmitted and collected by the CNT structure 13. The electrons can further be collected by the second electrode 15. As a result, an electric current goes through an electrical circuit outside of the photovoltaic device 10.

In conclusion, by way of disposing the CNT structure, the photoelectric conversion efficiency on the photovoltaic device is improved due to high light absorbability and high electric conductivity of the CNT structure. Furthermore, because the CNT structure has better mechanical strength, the durability of the photovoltaic device is also increased.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A photovoltaic device, comprising:
a silicon substrate having a front surface and a rear surface, wherein the silicon substrate is n-type silicon adapted to generate electron carriers;
an intrinsic layer disposed directly on the front surface of the silicon substrate;
a carbon nanotube structure disposed on and in direct contact with the intrinsic layer, and completely separated from the silicon substrate, the carbon nanotube structure comprising a plurality of successively oriented carbon nanotube segments joined end-to-end by van der Waals attractive force, wherein the plurality of carbon nanotubes segments comprises a plurality of carbon nanotubes substantially parallel to each other and parallel to the front surface of the silicon substrate, the carbon nanotube structure is adapted to absorb light and then generate hole carriers; and
a first electrode disposed on the rear surface of the silicon substrate.

2. The photovoltaic device as claimed in claim 1, wherein the silicon substrate is made of single-crystal silicon or polycrystalline silicon.

3. The photovoltaic device as claimed in claim 1, wherein a thickness of the silicon substrate is in a range from about 200 micrometers to about 300 micrometers.

4. The photovoltaic device as claimed in claim 1, wherein the intrinsic layer is made of silicon dioxide or silicon nitride.

5. The photovoltaic device as claimed in claim 1, wherein a thickness of the intrinsic layer is in a range from about 1 angstrom to about 30 angstrom.

6. The photovoltaic device as claimed in claim 1, wherein the carbon nanotube structure comprises at least one carbon nanotube layer.

7. The photovoltaic device as claimed in claim 6, wherein the at least one carbon nanotube layer comprises the plurality of carbon nanotubes.

8. The photovoltaic device as claimed in claim 6, wherein the at least one carbon nanotube layer comprises at least one carbon nanotube film; the at least one carbon nanotube film includes the plurality of successively oriented carbon nanotube segments joined end-to-end by van der Waals attractive force.

9. The photovoltaic device as claimed in claim 8, wherein the at least one carbon nanotube layer comprises a plurality of successively stacked carbon nanotube films, and the alignment direction of two adjacent carbon nanotube films is set at an angle to each other.

10. The photovoltaic device as claimed in claim 6, wherein the at least one carbon nanotube layer comprises one or more carbon nanotube wires comprising of the plurality of carbon nanotubes, each of the one or more carbon nanotube wires is in a twisted form or in a non-twisted form.

11. The photovoltaic device as claimed in claim 10, wherein in the twisted carbon nanotube wire, the carbon nanotubes are twisted along an axis of the twisted carbon nanotube wire.

12. The photovoltaic device as claimed in claim 6, wherein the at least one carbon nanotube layer comprises a plurality of co-planar carbon nanotube films, wherein each of the co-planar carbon nanotube films comprises the plurality of carbon nanotubes, and the plurality of carbon nanotubes in co-planar carbon nanotube films in the same plane are substantially parallel to one another.

13. The photovoltaic device as claimed in claim 1, wherein the carbon nanotube structure comprises at least two carbon nanotube layers; and wherein one carbon nanotube layer comprises of one or more carbon nanotube films and another carbon nanotube layer comprises of one or more carbon nanotube wires.

14. The photovoltaic device as claimed in claim 13, wherein the one or more carbon nanotube wires are adjacent to each of the one or more carbon nanotube films.

15. The photovoltaic device as claimed in claim 1, wherein the first electrode is made of aluminum, magnesium, or silver.

16. The photovoltaic device as claimed in claim 1, wherein a thickness of the first electrode is in a range from about 10 micrometers to about 300 micrometers.

17. The photovoltaic device as claimed in claim 1, further comprises a second electrode disposed on the carbon nanotube structure.

18. A photovoltaic device, comprising:
a silicon substrate having a front surface and a rear surface;
an intrinsic layer disposed directly on the front surface of the silicon substrate;
a carbon nanotube structure disposed on and in direct contact with the intrinsic layer, and completely separated from the silicon substrate by the intrinsic layer; and
a first electrode disposed on the rear surface of the silicon substrate.

* * * * *